US006880981B2

United States Patent
Nakano

(10) Patent No.: US 6,880,981 B2
(45) Date of Patent: Apr. 19, 2005

(54) OPTICAL COUPLING APPARATUS AND METHOD FOR MANUFACTURING THE SAME

(75) Inventor: Mitsuaki Nakano, Gose (JP)

(73) Assignee: Sharp Kabushiki Kaisha, Osaka (JP)

( * ) Notice: Subject to any disclaimer, the term of this patent is extended or adjusted under 35 U.S.C. 154(b) by 320 days.

(21) Appl. No.: 10/157,906

(22) Filed: May 31, 2002

(65) Prior Publication Data

US 2002/0181898 A1 Dec. 5, 2002

(30) Foreign Application Priority Data

May 31, 2001 (JP) ..................................... P2001-164933

(51) Int. Cl.[7] .............................................. G02B 6/36
(52) U.S. Cl. ......................................... 385/88; 385/84
(58) Field of Search ........................ 385/16, 84, 88–89, 385/94

(56) References Cited

U.S. PATENT DOCUMENTS 4,742,432 A * 5/1988 Thillays et al. ............. 361/783

6,661,031 B1 * 12/2003 Takaoka ....................... 257/98

FOREIGN PATENT DOCUMENTS

| JP | 60126873 | * | 7/1985 |
| JP | 60126874 | * | 7/1985 |
| JP | 10-93132 A | | 4/1998 |
| JP | 2000-15051 A | | 5/2000 |
| JP | 2000-150951 A | | 5/2000 |
| JP | 2001-217453 A | | 8/2001 |

* cited by examiner

Primary Examiner—Frank G. Font
Assistant Examiner—Eric Wong
(74) Attorney, Agent, or Firm—Birch, Stewart, Kolasch & Birch, LLP

(57) ABSTRACT

An object of the invention is to provide an optical coupling apparatus in which light-transmitting resin is prevented from entering a hole of a substrate, and a method for manufacturing the same. In this construction, a cushioning pattern is formed around each of the holes on the surface of the substrate. During a primary molding operation, a protrusion of an upper mold is brought into press-contact with the cushioning pattern formed around the hole of the substrate, so that the hole is blocked up perfectly, thereby preventing the light-transmitting resin from entering the hole.

2 Claims, 14 Drawing Sheets

OPTICAL COUPLING APPARATUS AND METHOD FOR MANUFACTURING THE SAME

BACKGROUND OF THE INVENTION

1. Field of the Invention

The present invention relates to an optical coupling apparatus for detecting a matter to be detected, and to a method for manufacturing said optical coupling apparatus.

2. Description of the Related Art

With reference to FIGS. 12 to 15, a process for manufacturing a conventional optical coupling apparatus will be described hereinbelow. Firstly, as shown in FIG. 12, on a substrate 101 are formed wiring patterns 102a to 102d. The substrate 101 is provided with holes 101a, and a plating layer 103 is so formed as to cover an inner wall of each of the holes 101a and the periphery thereof. Then, on each of the wiring patterns 102a is mounted a light-receiving element 104, and on each of the wiring patterns 102c is mounted a light-emitting element 105. The light-receiving elements 104 are each connected to their respective wiring patterns 102b via a bonding wire 106, and the light-emitting elements 105 are each connected to their respective wiring patterns 102d via a bonding wire 107.

Subsequently, as shown in FIG. 13, by a transfer molding operation, primary molded bodies 111 and 112 are formed from light-transmitting resin so as to cover the light-receiving elements 104 and the light-emitting elements 105, respectively. That is, the light-receiving and light-emitting elements 104 and 105 are contained in the primary molded bodies 111 and 112.

Further, as shown in FIG. 14, by an injection molding operation, a secondary molded body 113 is formed from light-shielding resin, in such a way as to fill in the gap between the primary molded bodies 111 and 112, and to fill in a recess 112a of the light-emitting-element 105-side primary molded body 112. This configuration helps keep the light-receiving element 104 from incidence of light that has been emitted from the side face of the light-emitting element 105 and then reflected from components arranged around the coupling apparatus. Moreover, since the secondary molded body 113 cannot be bonded to the primary molded body 111, 112 because of their difference in material, light-shielding resin is poured into each of the holes 101a of the substrate 101 and is then solidified, so that the secondary molded body 113 is fixed to the substrate 101.

Thereafter, the construction is subjected to dicing along broken lines shown in FIG. 14 to obtain two pieces of optical coupling apparatuses 121 as shown in FIG. 15.

As shown in FIGS. 16 to 18, in reality, a larger number of continuously-arranged optical coupling apparatuses are fabricated concurrently, and they are separated from one another by dicing. For example, on a substrate measuring 46 mm by 136 mm is formed a 16 by 38 array of optical coupling apparatuses (608 pieces in total), and the construction is subjected to dicing to separate the optical coupling apparatuses from one another.

In the optical coupling apparatus 121, detection of a to-be-detected matter is carried out as follows. The light-emitting element 105 is driven to emit light, and the light reflected from the to-be-detected matter is guided in such a way as to be incident on the light-receiving element 104. Alternatively, there is formed an optical path for guiding light from the light-emitting element 105 toward the light-receiving element 104. In the latter case, the to-be-detected matter is detected on the basis of variation in the output of the light-receiving element 104 as observed when the optical path is blocked by the to-be-detected matter.

Incidentally, the primary molded bodies 111 and 112 are formed as follows. As shown in FIG. 19, an upper mold 131 and a lower mold 132 are placed so as to have sandwiched therebetween the substrate 101. After the upper and lower molds 131 and 132 are closed, light-transmitting resin is filled in cavities 133 and 134 of the upper mold 131. At this time, as shown in FIG. 20, a protrusion 131a of the upper mold 131 is brought into press-contact with the periphery of the hole 101a of the substrate 101 to cover the hole 101a. This prevents the light-transmitting resin from entering the hole 101a. Although, in this figure, the substrate 101 is taken as a minimum unit that corresponds to a single optical coupling apparatus, in reality, as shown in FIGS. 16 to 18, a large-sized substrate corresponding to a multiplicity of continuously-arranged optical coupling apparatuses is sandwiched between the upper and lower molds.

However, such a conventional construction encounters the following problem. In general, the components constituting the optical coupling apparatus, such as the substrate 101, the plating layer, and the resist layer are each given certain thickness tolerance, and thus a layered body composed of the components including the substrate 101 incurs an uneven thickness. That is, the layered body varies in thickness from part to part, giving rise to lack of uniformity in the thickness. Hence, the region of the substrate 101 around a multiplicity of the holes 101a also incurs uneven thickness. Meanwhile, the dimensions of the upper and lower molds 131 and 132 are determined on the assumption that the layered body has a uniform thickness. Thus, in a case where the region of the substrate 101 around the holes 101a is made smaller in thickness than the gap between the protrusion 131a of the upper mold 131 and the lower mold 132, it is impossible to bring the protrusion 131a of the upper mold 131 fully into press-contact with the periphery of the holes 101a, which results in a gap having a size of a few tens of μm being developed between the protrusion 131a of the upper mold 131 and the periphery of the holes 101a. As a result, part of the light-transmitting resin finds its way into the holes 101a through the gap, and thereby the holes 101a are blocked up.

If the holes 101a of the substrate 101 are filled with the light-transmitting resin in that way, the light-shielding resin is prevented from entering the holes 101a of the substrate 101. This causes the secondary molded body 113 to come off from the substrate 101. To prevent this, upon completion of the molding of the primary molded bodies 111 and 112, whether the light-transmitting resin has gotten into the holes 101a or not is checked. If the intrusion is confirmed, the light-transmitting resin trapped in the holes 101a is manually removed. In order to facilitate the removal of the light-transmissive resin, as described previously, the plating layer 103 is formed so as to cover the inner wall of the hole 101a and the periphery thereof.

Moreover, the dimension of the lower mold 132 is so determined that the layered body composed of the substrate 101, etc. protrudes slightly beyond the lower mold 132. This causes, when the upper and lower molds 131 and 132 are put together, the upper mold 131 to be brought fully into press-contact with the slightly-protruding layered body.

In this case, however, the uneven thickness of the substrate 101 in particular becomes problematic. In the manufacturing process, since a multiplicity of substrates are dealt with, the uneven thicknesses of these substrates lead to variation in the length of the jutted part of the layered body from the lower mold 132. Consequently, the upper mold 131 fails to fully make press-contact with the layered body, or the pressure exerted on the layered body becomes unduly great, which results in breakage of the layered body.

In view of the foregoing, as shown in FIG. 21A, there are prepared a plurality of shims 141 having mutually different thicknesses. Then, as shown in FIGS. 21B and 21C, the one having a suitable thickness selected from among the shims is arranged between the substrate 101 and the lower mold 132, so that the layered body composed of the substrate 101, etc. protrudes beyond the lower mold 132 appropriately.

Practically, a multiplicity of substrates are classified according to the thickness before delivery. Thus, selection of the shim is made according to the thickness of the substrate. However, prior to setting the shim in the lower mold 132, the shim needs to be selected on a substrate-by-substrate basis, which leads to remarkably poor operation efficiency. Furthermore, it is necessary to make a request of substrate manufacturers for measurement of the thickness of the substrate and submission of the measurement data. This increases the cost required for the production of the substrate.

Meanwhile, the substrate has a plurality of holes formed thereon for positioning the substrate relative to the mold. With respect to the positions of these holes, the primary and secondary molded bodies are formed separately using different molds.

However, an adverse effect is likely to occur because of synergy between a molding error as observed in the primary molded body and that observed in the secondary molded body, which may result in defective pieces of optical coupling apparatuses being produced. In this case, prior to forming the secondary molded body, by properly adjusting the positioning of the substrate relative to the mold at the discretion of workers concerned, the mutual errors between the primary and secondary molded bodies can be minimized. However, to achieve this, the workers are required to have a great deal of skill, and the operation efficiency is impaired.

SUMMARY OF THE INVENTION

The invention has been devised in view of the above-described problems with the conventional art, and accordingly its object is to provide an optical coupling apparatus which offers the advantages of: preventing light-transmitting resin from entering a hole of a substrate; allowing a mold to be constantly kept in press-contact with the substrate under adequate pressure; and suppressing mutual errors between a first and a second molded body. Another object of the invention is to provide a method for manufacturing said optical coupling apparatus.

The invention provides an optical coupling apparatus comprising:

a substrate having a hole formed thereon;

a light-emitting element disposed on the substrate;

a light-receiving element disposed on the substrate;

a cushioning member disposed around an opening of the hole on a surface of the substrate;

a pair of primary molded bodies made of light-transmitting resin, for covering the light-emitting element and the light-receiving element, respectively; and a secondary molded body made of light-shielding resin interposed between the primary molded bodies, the secondary molded body being fixed onto the substrate by being fitted into the hole of the substrate.

According to the invention, there is provided a cushioning member around the opening of the hole on the surface of the substrate. Thus, when the mold is brought into press-contact with the periphery of the hole of the substrate, the cushioning member is crushed by the mold, so that the mold makes intimate contact with the cushioning member. Consequently, the hole of the substrate is blocked up perfectly, thereby preventing the light-transmitting resin from entering the hole of the substrate.

In the invention, it is preferable that the hole of the substrate is so shaped that its diameter changes gradually, i.e. is stepped-configured, and that an inner wall defining the hole is subjected to metal plating treatment.

According to the invention, since the substrate has a hole stepped-configured, light-shielding resin can be caught in the hole properly, so that the secondary molded body is securely fixed to the substrate. Moreover, since the inner wall defining the hole is subjected to metal plating treatment, even if light-transmitting resin adheres to the hole, the light-transmitting resin can be removed with ease.

The invention further provides a method for manufacturing an optical coupling apparatus, comprising the steps of:

providing a layered body on a substrate having a hole formed thereon, for arranging a light-emitting element and a light-receiving element;

disposing a cushioning member around an opening of the hole on a surface of the substrate;

forming a pair of primary molded bodies from light-transmitting resin by using a mold for forming a primary molded body, which is composed of an upper mold portion and a lower mold portion, with the hole kept in a blocked state by the mold, the primary molded bodies being so designed as to cover the light-emitting element and the light-receiving element, respectively, arranged on the substrate; and forming a secondary molded body from light-shielding resin by using a mold for forming a secondary molded body, which is composed of an upper mold portion and a lower mold portion, the secondary molded body being interposed between the primary molded bodies and fixed onto the substrate by being fitted in the hole.

According to the invention, after a cushioning member is disposed around the opening of the hole on the surface of the substrate, the primary molded body is formed of light-transmitting resin using the mold for forming a primary molded body (hereafter referred to as the primary-mold forming mold). In this structure, since the primary-mold forming mold is kept in press-contact with the periphery of the hole of the substrate, the cushioning member is crushed by the mold, so that the mold makes intimate contact with the cushioning member. Consequently, the hole of the substrate is blocked up perfectly, thereby preventing the light-transmitting resin from entering the hole of the substrate.

In the invention, it is preferable that the cushioning member is formed by a silk printing or resist printing technique.

According to the invention, by adopting either the silk printing or resist printing technique, a cushioning member of desired pattern can be readily formed.

In the invention, it is preferable that the cushioning member is disposed on a primary molding surface of the substrate, on which the primary molded body is formable by using the primary-mold forming mold.

According to the invention, the cushioning member is disposed on the primary molding surface of the substrate, on which the primary molded body is formable by using the primary-mold forming mold. This makes it possible to bring the primary-mold forming mold into press-contact with the cushioning member.

In the invention, it is preferable that at least one of the primary-mold forming mold and the secondary-mold forming mold is provided with another cushioning member which is disposed between its lower mold portion and the substrate.

According to the invention, another cushioning member is disposed between the lower mold portion and the substrate. Thus, when the upper and lower mold portions are put together, pressure is exerted on the cushioning member through the substrate, with the result that the cushioning member is crushed. Due to this crushing, the cushioning member is reduced in thickness, whereby making it possible to compensate for variation in the thickness of the substrate. This allows the upper mold portion to be kept in press-contact with the substrate under adequate pressure.

In the invention, it is preferable that, on the occasion of forming each of the primary molded bodies using the primary-mold forming mold, a member for positioning the secondary-mold forming mold is formed at a location on the substrate that is kept off the area secured for the optical coupling apparatus.

According to the invention, there exists a primary-molding error at the location of the positioning member formed by using the primary-mold forming mold. With this in view, if the secondary-mold forming mold is positioned with respect to the location of the positioning member, at the location of the secondary molded body formed of light-shielding resin by using the secondary-mold forming mold, an error is present that is equivalent to the error found in the primary molded body formed by using the primary-mold forming mold. Consequently, the mutual errors between the primary and secondary molded bodies can be minimized.

In the invention, it is preferable that the substrate has a stepped-configured hole or through hole formed at a position thereof where the positioning member is formed.

According to the invention, the positioning member is formed at the location of the stepped-configured hole or through hole, and is thus securely fixed onto the substrate.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
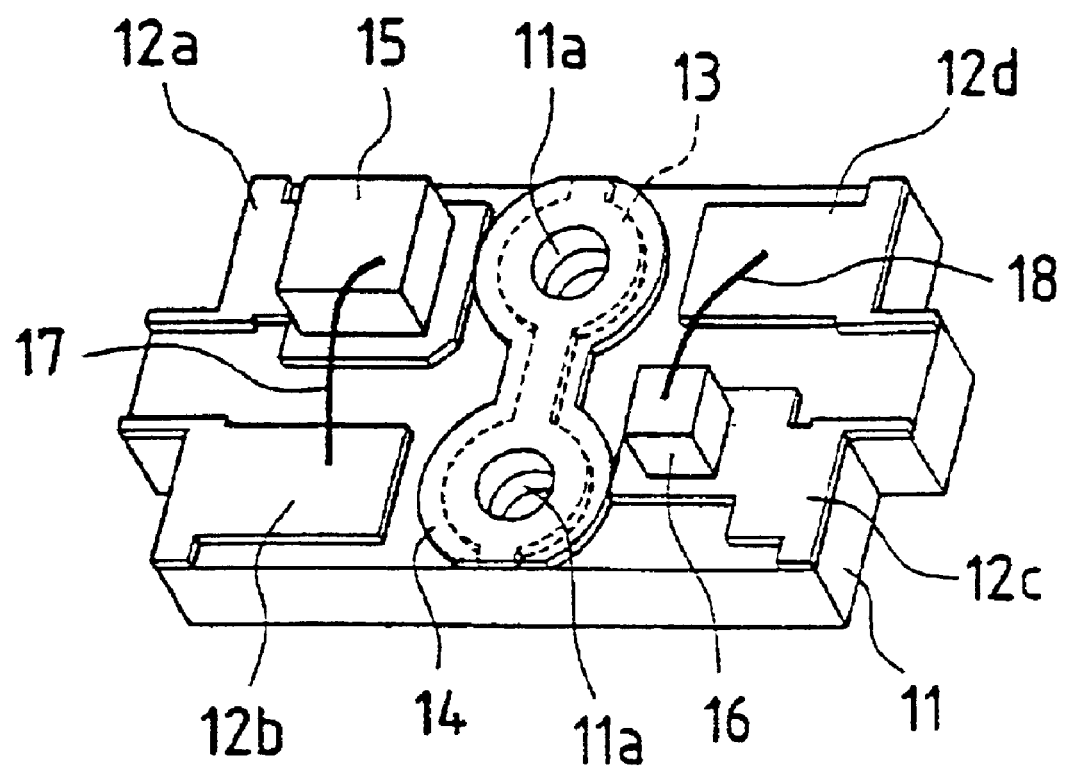
FIG. 1 is a perspective view of a substrate having a light-emitting element and a light-receiving element mounted thereon, illustrating a process for manufacturing an optical coupling apparatus according to one embodiment of the invention.

Now referring to the drawings, preferred embodiments of the invention are described below.

Figure 2A:
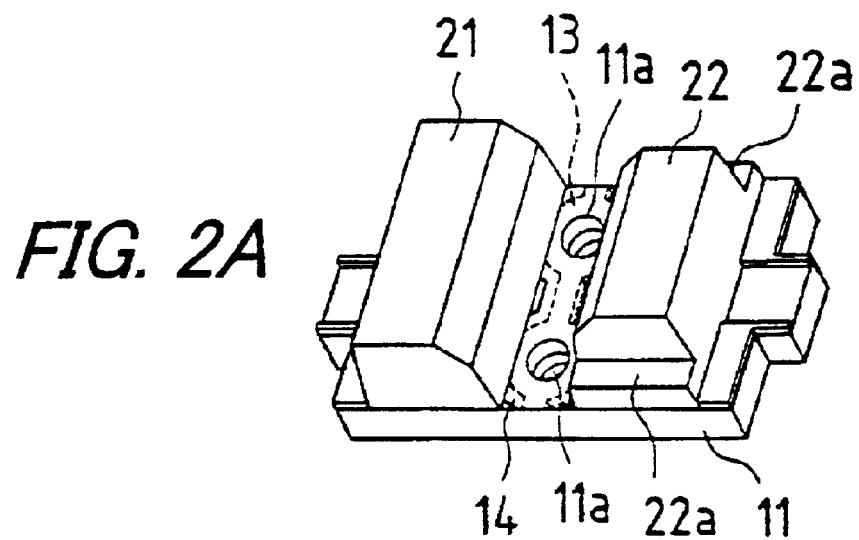
FIGS. 2A to 2C are a perspective view, a plan view, and a sectional view, respectively, of the substrate on which a primary molded body is formed, illustrating another process for manufacturing the optical coupling apparatus according to the embodiment.
Figure 2B:
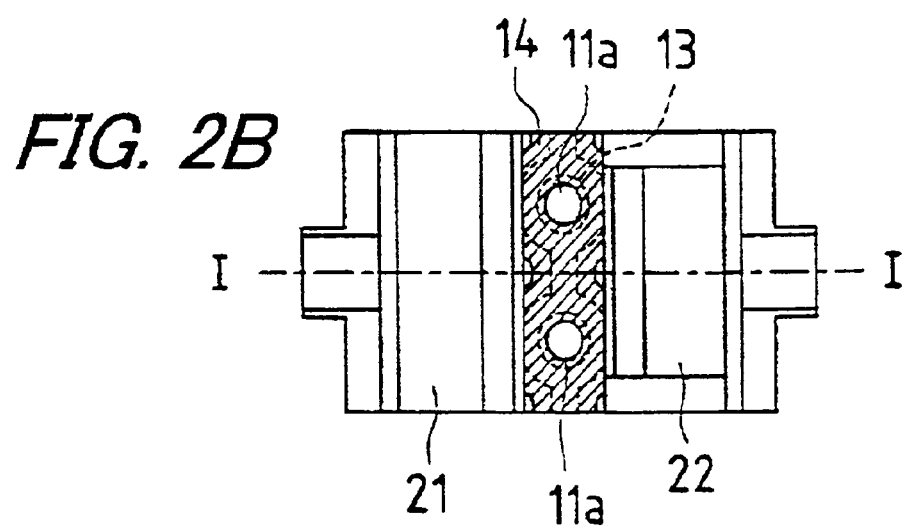
Figure 2C:
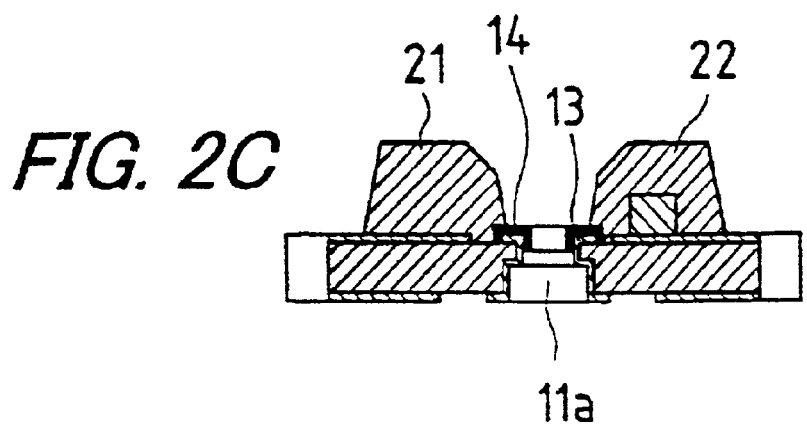
Figure 3A:
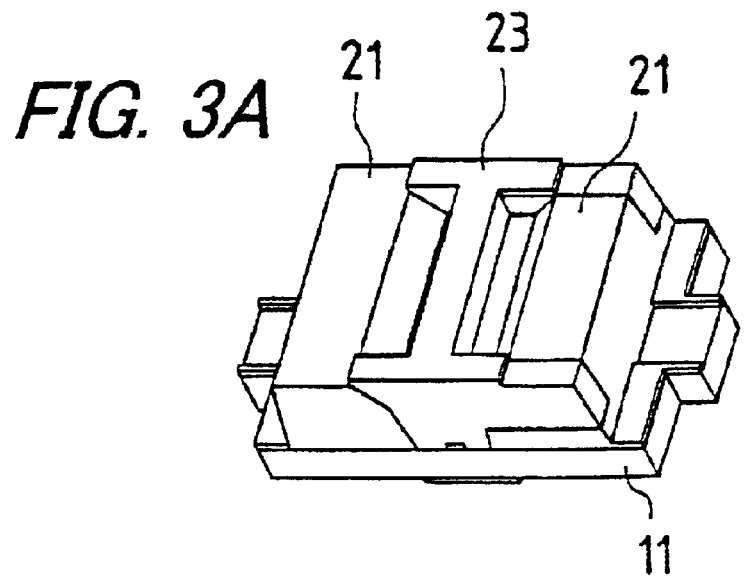
FIGS. 3A to 3C are a perspective view, a plan view, and a sectional view, respectively, of the substrate on which a secondary molded body is formed, illustrating still another process for manufacturing the optical coupling apparatus according to the embodiment.
Figure 3B:
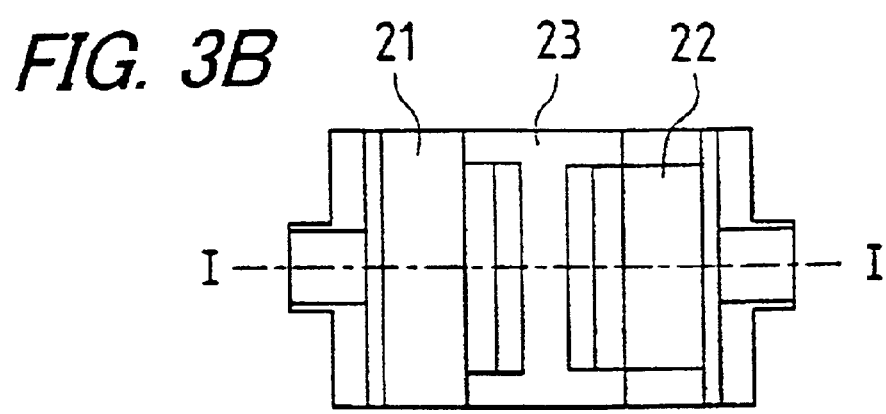
Figure 3C:
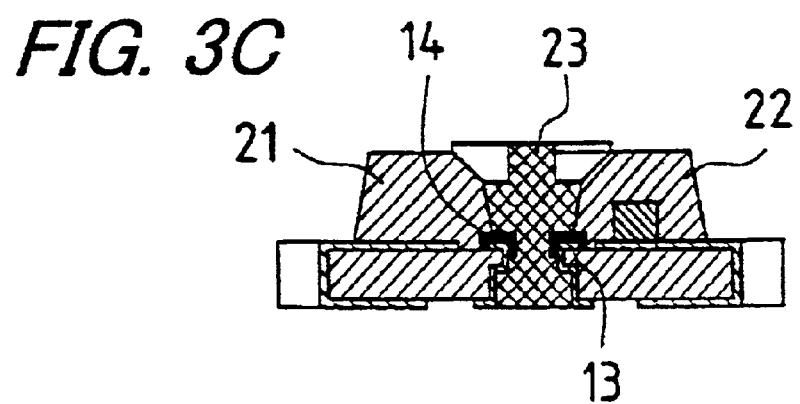

FIGS. 1, 2A to 2C, and 3A to 3C respectively show a manufacturing process in the manufacturing method according to one embodiment of the invention. FIG. 1 is a perspective view showing a substrate having a light-emitting element and a light-receiving element mounted thereon. FIGS. 2A to 2C are a perspective view, a plan view, and a sectional view, respectively, showing the substrate on which a primary molded body is formed. FIGS. 3A to 3C are a perspective view, a plan view, and a sectional view, respectively, showing the substrate on which a secondary molded body is formed.

The manufacturing method according to the embodiment includes a number of steps set forth hereunder. Firstly, as shown in FIG. 1, on a substrate 11 are formed wiring patterns 12a to 12d. The substrate 11 is provided with holes 11a, and a plating layer 13 is formed so as to cover an inner wall defining each of the holes 11a and the periphery thereof. Then, by adopting either the silk printing or resist printing technique, a cushioning pattern 14 is formed around an opening of the hole 11a on the surface of the substrate 11. On the wiring pattern 12a is mounted a light-receiving element 15, and on the wiring pattern 12c is mounted a light-emitting element 16. The light-receiving element 15 is connected to the wiring pattern 12b via a bonding wire 17, and the light-emitting element 16 ago is connected to the wiring pattern 12d via a bonding wire 18.

Subsequently, as shown in FIGS. 2A to 2C, by a primary molding operation, primary molded bodies 21 and 22 are formed from light-transmitting resin so as to contain therein the light-receiving elements 15 and the light-emitting elements 16, respectively.

Figure 4A:
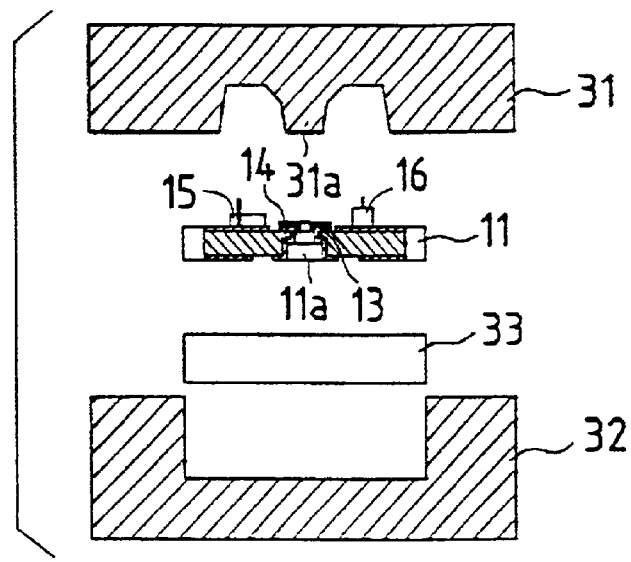
FIGS. 4A and 4B are views schematically showing a primary-mold forming mold employed in the embodiment.
Figure 4B:
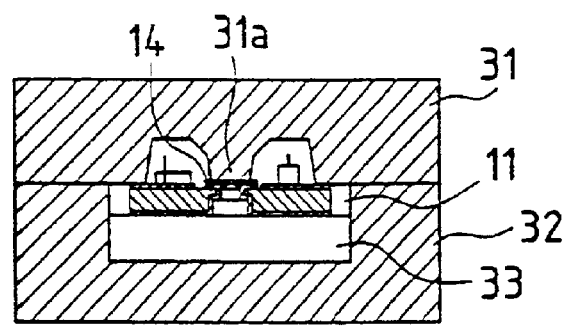
Figure 5:
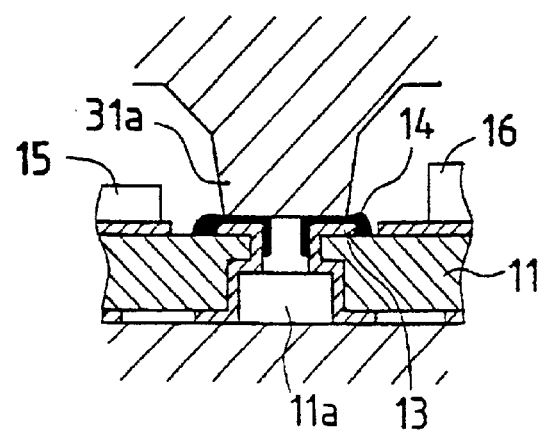
FIG. 5 is an enlarged view showing part of the construction shown in FIG. 4B.

The primary molding operation is carried out as follows. As shown in FIGS. 4A and 4B, an upper mold 31 and a lower mold 32 are placed so as to have sandwiched therebetween the substrate 11, and then light-transmitting resin is filled in spaces of the upper mold 31. Thereby, the primary molded bodies 21 and 22 are fabricated. At this time, as shown in FIG. 5, a protrusion 31a of the upper mold 31 is brought into press-contact with the cushioning pattern 14 disposed around the opening of the hole 11a on the top surface of the substrate 11, namely, a primary molding surface. This causes the cushioning pattern 14 to be crushed, creating a bank of the cushioning pattern 14 around the opening of the hole 11a. Consequently, the protrusion 31a of the upper mold 31 is brought into intimate contact with the cushioning pattern 14. In this structure, even if a layered body composed of the substrate 11, the wiring patterns, a resist layer (not shown), and other components has an uneven thickness, by making the cushioning pattern 14 substantially thick, it is possible to allow the protrusion 31a of the upper mold 31 to crash the cushioning pattern 14 without fail. As a result, the hole 11a is blocked up, thereby preventing the light-transmitting resin from entering the hole 11a during the primary molding operation.

Moreover, as shown in FIGS. 4A and 4B, a cushioning sheet 33 is sandwiched between the substrate 11 and the lower mold 32. This enables the layered body composed of the substrate 11, etc. to protrude sufficiently beyond the lower mold 32. Therefore, when the upper and lower molds 31 and 32 are put together, pressure is exerted on the cushioning sheet 33 through the substrate 11, with the result that the cushioning sheet 33 is crushed. Reduction in the thickness of the cushioning sheet 33 due to the crashing compensates for the variation in the thickness of the substrate 11. Thus, the upper mold 31 is brought into press-contact with the substrate 11 under adequate pressure.

Further, as shown in FIGS. 3A to 3C, by a secondary molding operation, a secondary molded body 23 is formed from light-shielding resin in such a way as to get into the region between the primary molded bodies 21 and 22 and to get into a recess 22a of the light-emitting element 16-side primary molded body 22. This structure helps keep the light-receiving element 15 from incidence of light that has been emitted from the side face of the light-emitting element 16 and then reflected from certain components arranged around the optical coupling apparatus. Moreover, since the secondary molded body 23 and the primary molded body 21, 22 cannot be bonded to each other because of their difference in material, the secondary molded body 23 is directed into each of the holes 11a of the substrate 11 and is then solidified, so that the secondary molded body 23 is fixed to the substrate 11. Besides, each of the holes 11a is so shaped that its diameter changes gradually, i.e. is stepped-configured. This allows the secondary molded body 23 to be caught in the holes 11a of the substrate 11 properly, so that the shielding resin 23 is securely fixed to the substrate.

Figure 6:
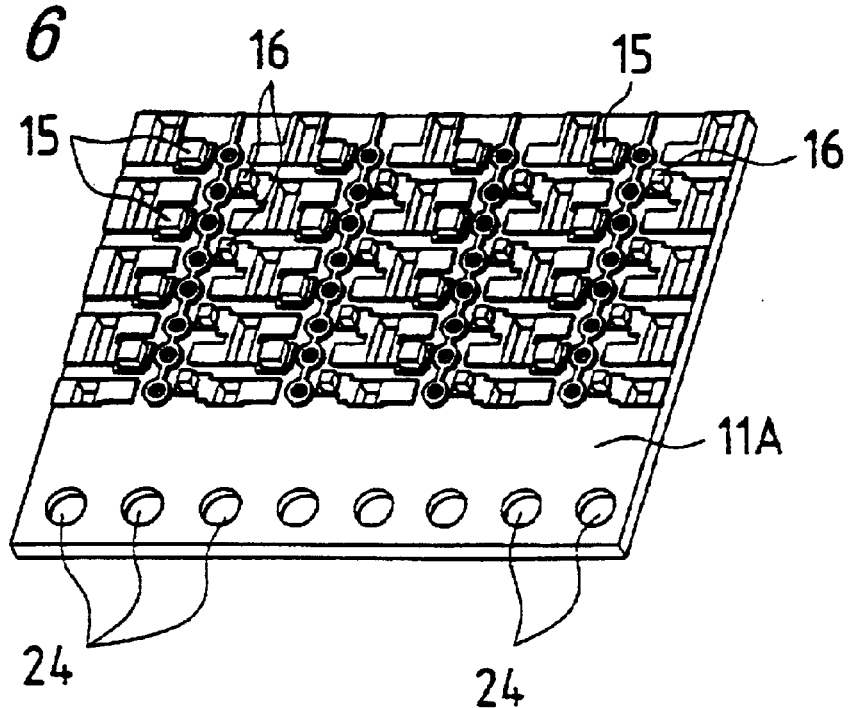
FIG. 6 is a perspective view showing a process for manufacturing a multiplicity of optical coupling apparatuses according to the embodiment.
Figure 7:
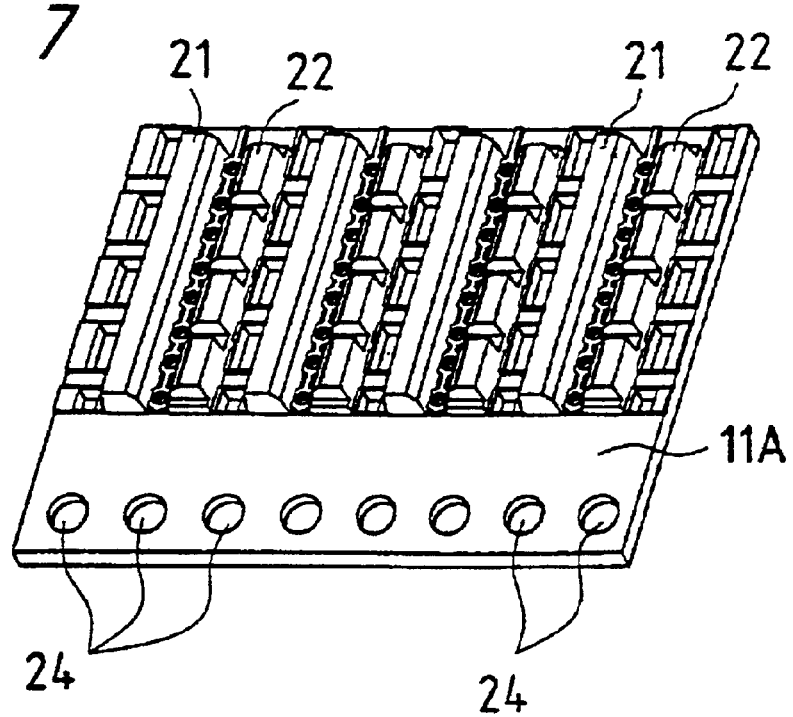
FIG. 7 is a perspective view showing another process for manufacturing a multiplicity of optical coupling apparatuses according to the embodiment.
Figure 8:
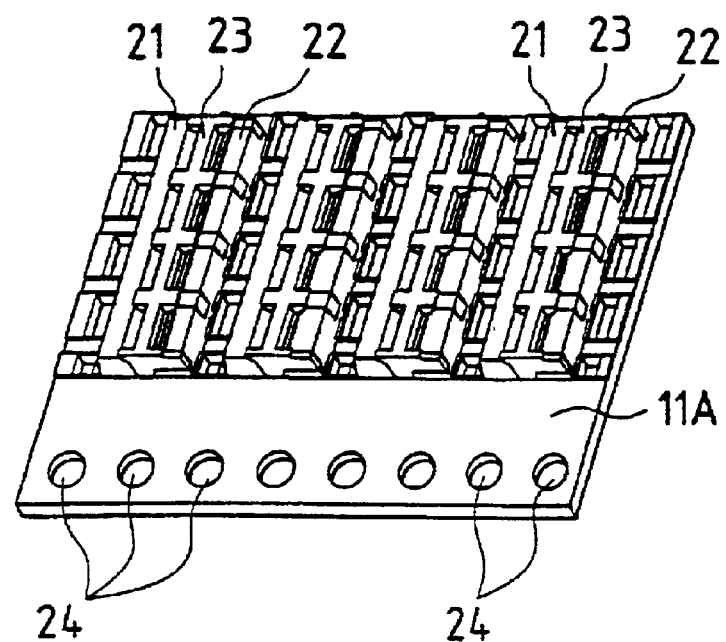
FIG. 8 is a perspective view showing still another process for manufacturing a multiplicity of optical coupling apparatuses according to the embodiment.

Practically, as shown in FIGS. 6, 7, and 8, a larger number of continuously-arranged optical coupling apparatuses are fabricated concurrently. That is, as shown in FIG. 6, firstly, on a substrate 11A are mounted a multiplicity of light-receiving elements 15 and light-emitting elements 16. Then, as shown in FIG. 7, by the primary molding operation, the primary molded bodies 21 and 22 are formed so as to contain therein the light-receiving element 15 and light-emitting element 16, respectively. Subsequently, as shown in FIG. 8, the secondary molded bodies 23 are formed by the secondary molding operation. On the occasion of the primary and secondary molding operations, the protrusions of the mold are fitted in their respective holes 24 pierced on the substrate 11A, so that the substrate 11A is positioned relative to the mold. Lastly, the optical coupling apparatuses are separated from one another by dicing. For example, on the substrate 11A measuring 46 mm by 136 mm is formed a 16 by 38 array of optical coupling apparatuses (608 pieces in total), and the construction is subjected to dicing to separate the optical coupling apparatuses from one another.

Note that, in the optical coupling apparatus in accordance with the embodiment under discussion, detection of a to-be-detected matter is carried out as follows. The light-emitting element 16 is driven to emit light, and the light reflected from the to-be-detected matter is guided in such a way as to be incident on the light-receiving element 15. Alternatively, an optical path is formed for guiding light from the light-emitting element 16 toward the light-receiving element 15. In the latter case, the to-be-detected matter is detected on the basis of variation in the output of the light-receiving element 15 as observed when the optical path is blocked by the to-be-detected matter.

As described thus far, in this embodiment, the cushioning pattern 14 is formed around the holes 11a on the surface of the substrate 11. On the occasion of the primary molding operation, the protrusion 31a of the upper mold 31 is securely brought into intimate contact with the cushioning pattern 14 around the holes 11a of the substrate 11. Thus, the holes 11a are blocked up, thereby preventing the light-transmitting resin from entering the holes 11a. Further, since the plating layer 13 is formed so as to cover the inner wall of the hole 11a and its periphery, even though the hole 11a is filled with the light-transmitting resin, it is possible to remove the light-transmitting resin contained within the hole 11a with ease. Besides, when the upper and lower molds 31 and 32 are put together, the cushioning sheet 33 is crushed, and reduction in the thickness of the cushioning sheet 33 due to the crushing compensates for the variation in the thickness of the substrate 11. This allows the upper mold 31 to be kept in press-contact with the substrate 11 under adequate pressure. Accordingly, in this embodiment, in contrast to the conventional example, there is no need to place between the substrate and the lower mold a shim which has been suitably selected from among a plurality of ones according to the thickness of the substrate, and thus the operation efficiency can be improved. In addition, there is no need to conduct a measurement of substrate thickness, which yields an advantage in reducing the cost required for the production of the substrate.

Figure 9:
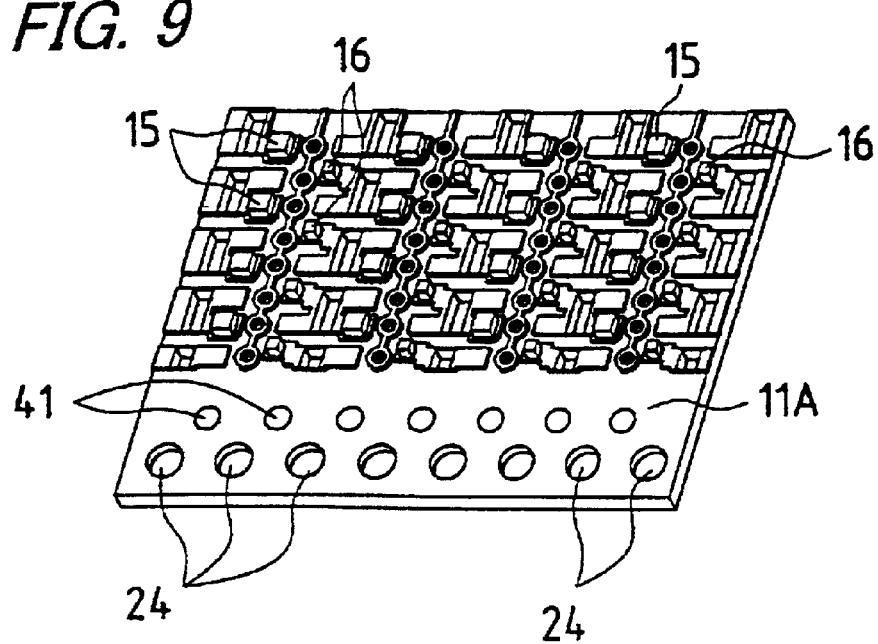
FIG. 9 is a perspective view showing a process for manufacturing a multiplicity of optical coupling apparatuses according to a modified example of the embodiment.
Figure 10:
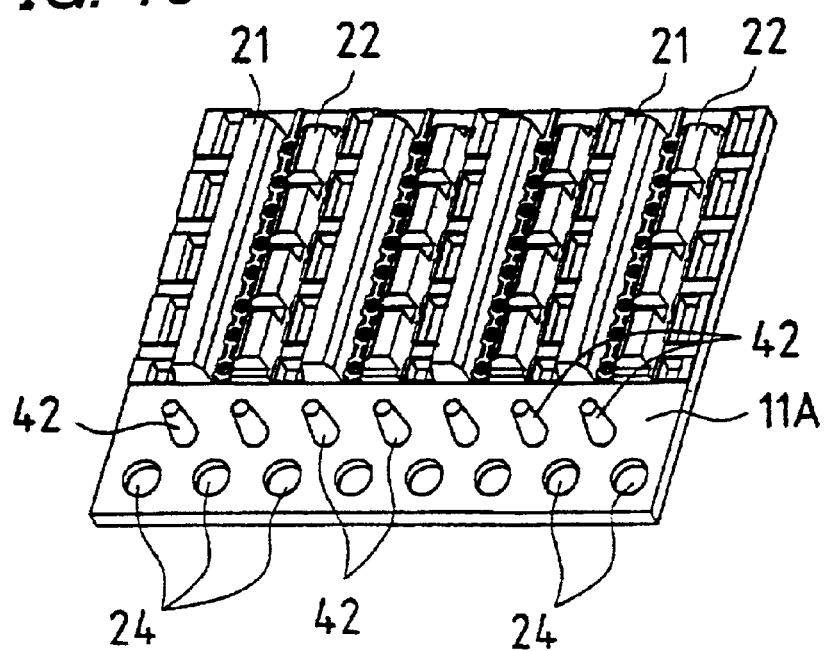
FIG. 10 is a perspective view showing another process for manufacturing a multiplicity of optical coupling apparatuses according to the modified example of the embodiment.
Figure 11:
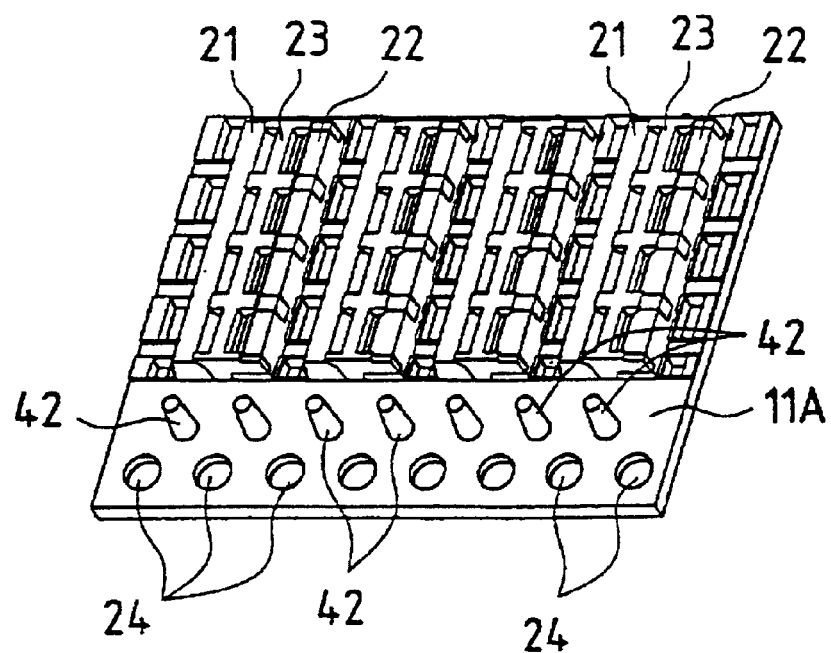
FIG. 11 is a perspective view showing still another process for manufacturing a multiplicity of optical coupling apparatuses according to the modified example of the embodiment.
Figure 12:
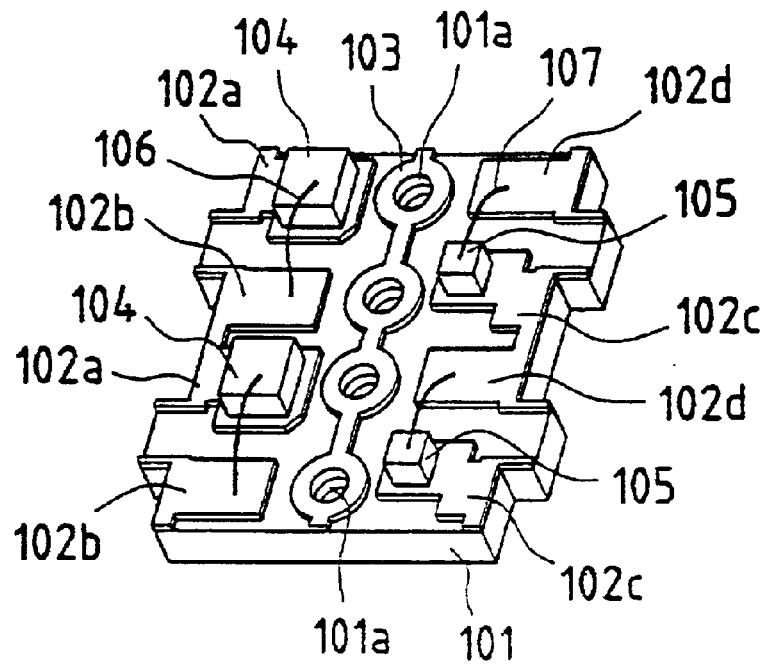
FIG. 12 is a perspective view of a substrate having a light-emitting element and a light-receiving element mounted thereon, illustrating a process for manufacturing a conventional optical coupling apparatus.
Figure 13:
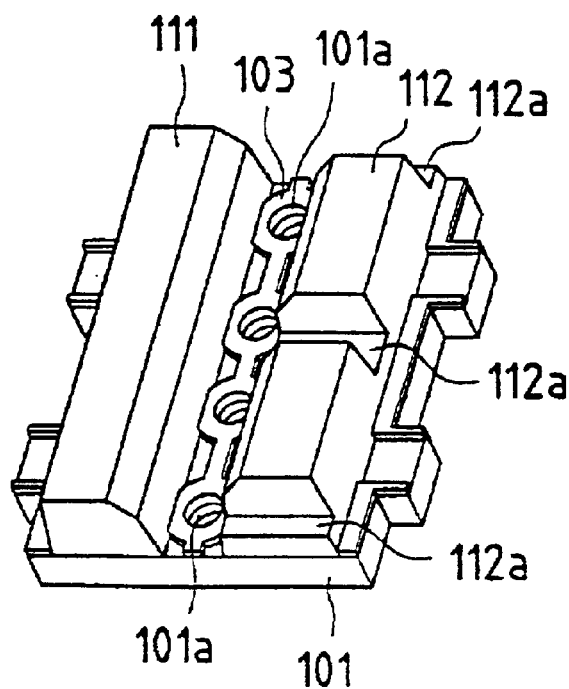
FIG. 13 is a perspective view of the substrate on which a primary molded body is formed, illustrating another process for manufacturing the conventional optical coupling apparatus.
Figure 14:
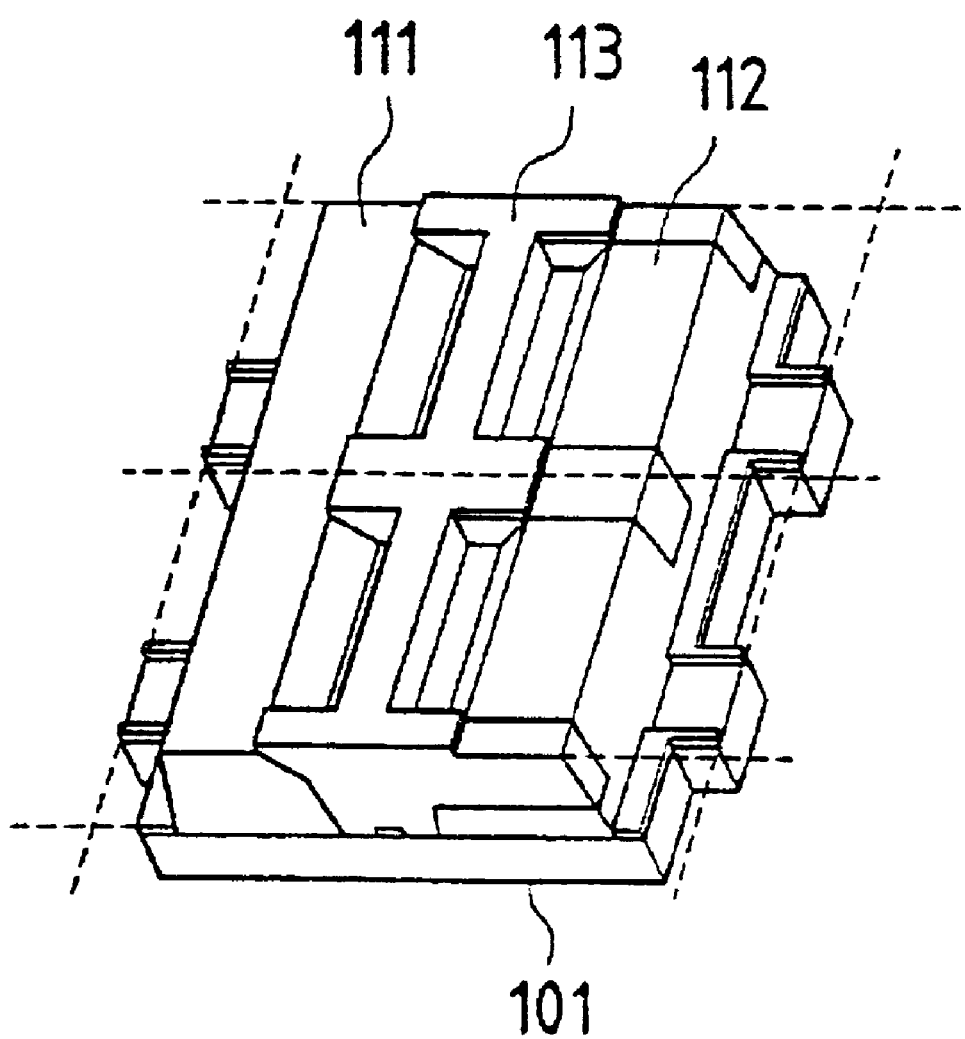
FIG. 14 is a perspective view of the substrate on which a secondary molded body is formed, illustrating still another process for manufacturing the conventional optical coupling apparatus.
Figure 15:
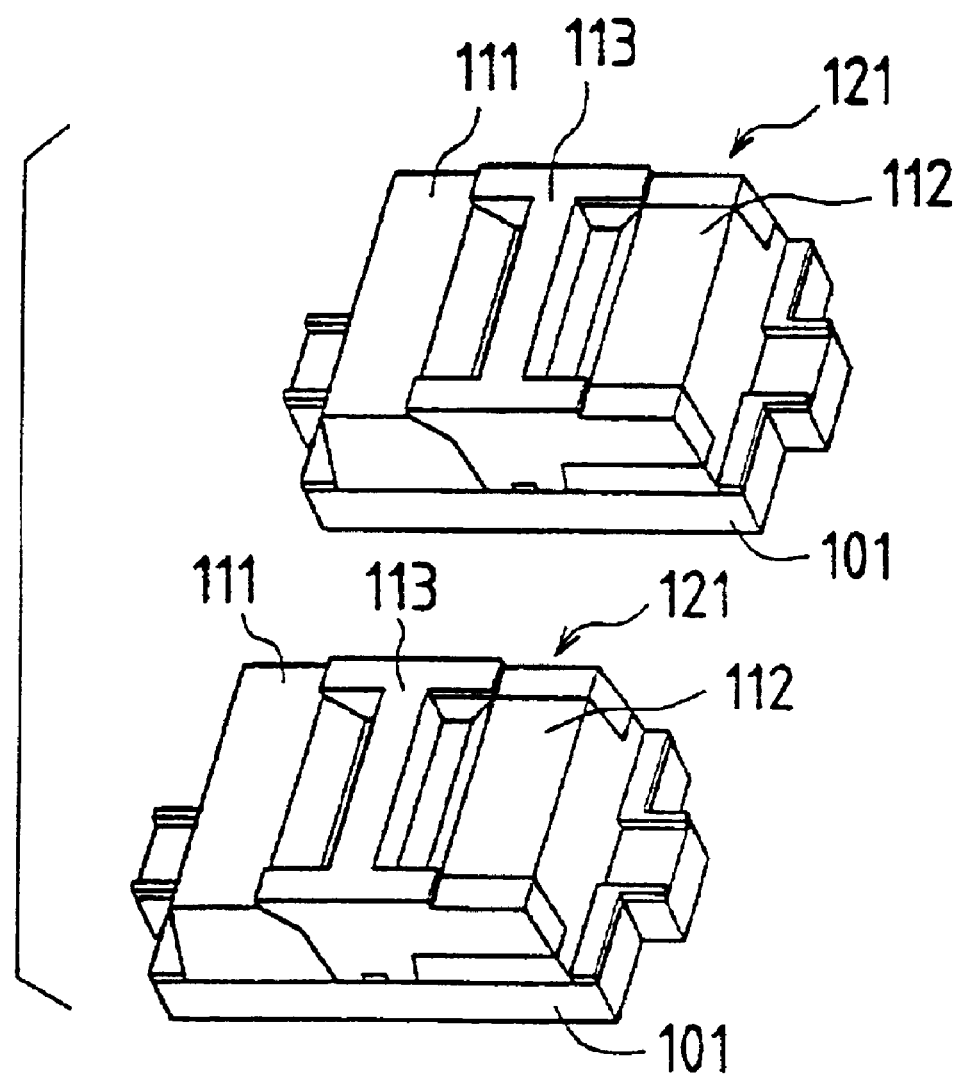
FIG. 15 is a perspective view of two separate optical coupling apparatuses, illustrating further another process for manufacturing the conventional optical coupling apparatus.
Figure 16:
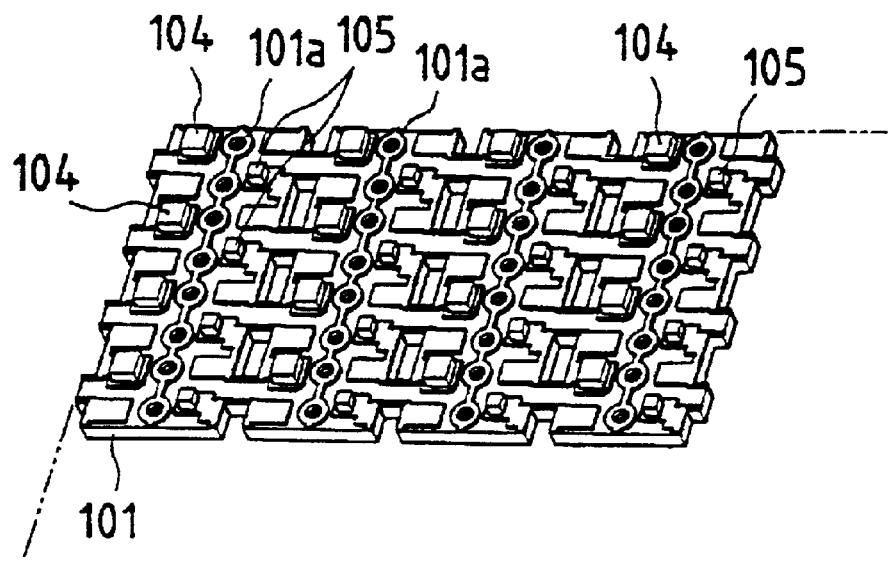
FIG. 16 is a perspective view showing a process for manufacturing a multiplicity of conventional optical coupling apparatuses.
Figure 17:
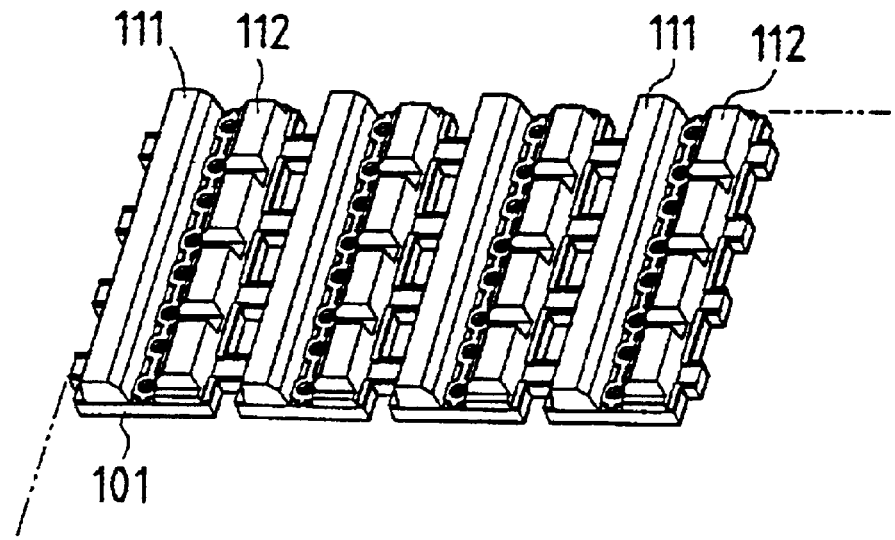
FIG. 17 is a perspective view showing another process for manufacturing a multiplicity of conventional optical coupling apparatuses.
Figure 18:
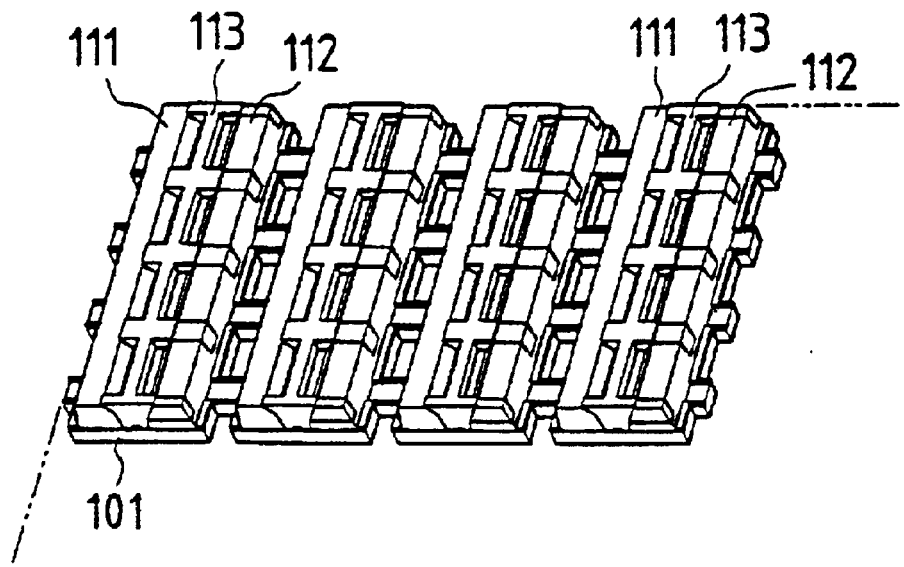
FIG. 18 is a perspective view showing still another process for manufacturing a multiplicity of conventional optical coupling apparatuses.
Figure 19:
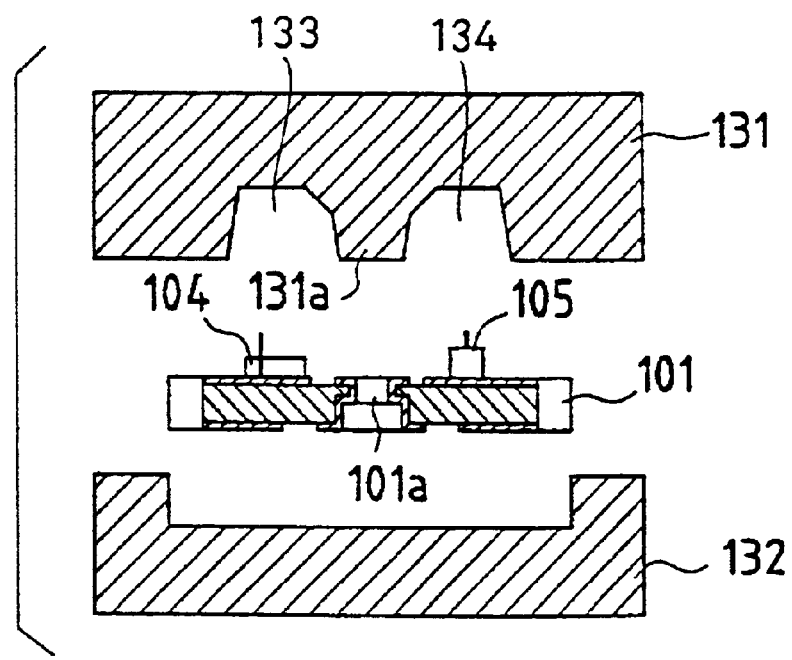
FIG. 19 is a view schematically showing a conventional primary-mold forming mold.
Figure 20:
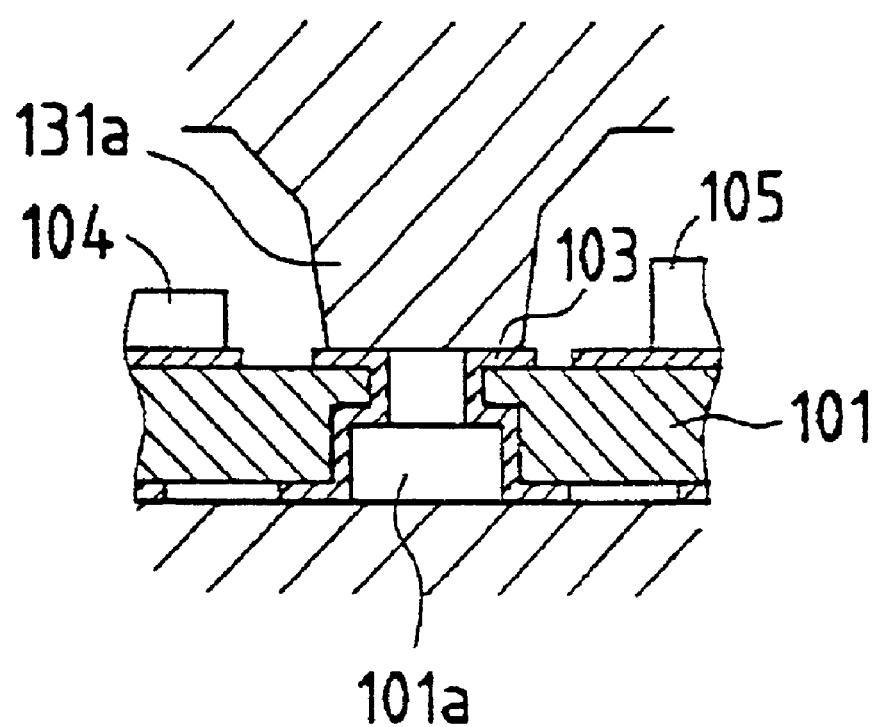
FIG. 20 is an enlarged view showing part of the construction shown in FIG. 19.
Figure 21A:
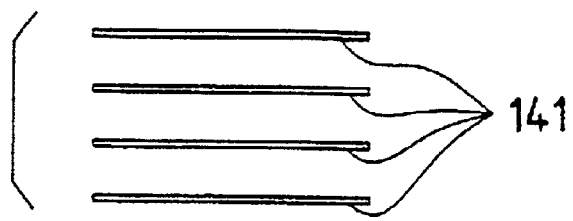
FIG. 21A is a side view showing a plurality of shims, and 21B and 21C are views schematically showing the conventional primary-mold forming mold and the shims.
Figure 21B:
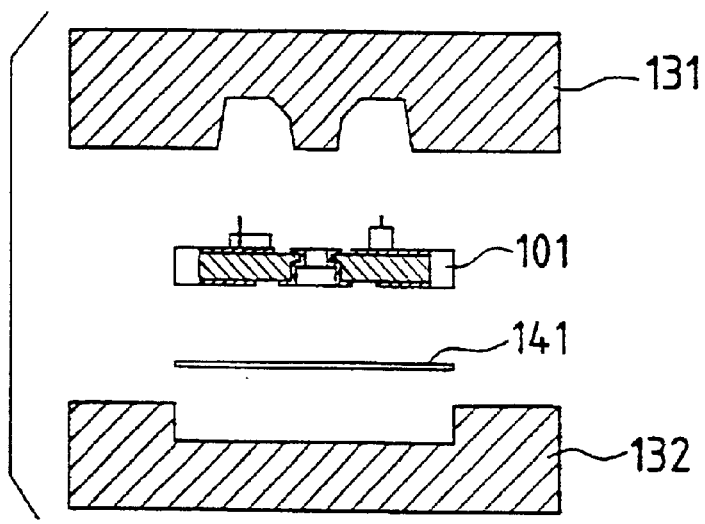
Figure 21C:
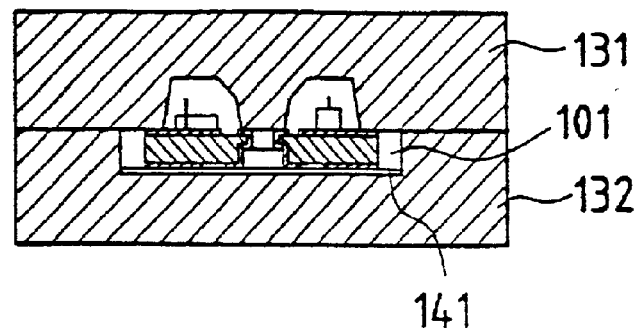

Incidentally, as shown in FIG. 9, the substrate 11A has stepped-configured holes 41 formed at several positions on part of its surface that is kept off the area secured for the optical coupling apparatuses. Hereupon, on the occasion of the primary molding operation, not only the primary molded bodies 21 and 22 are formed, but also positioning protrusions 42 as shown in FIG. 10 are formed in their respective stepped-configured holes 41. Meanwhile, on the occasion of the secondary molding operation, with respect to the position of each of the positioning protrusions 42 on the substrate 11A, the secondary molded body 23 is formed, as shown in FIG. 11. Note that the positioning protrusions 42 may alternatively be formed either on the under surface or on both surfaces of the substrate 11A, and that through holes may be formed instead of the stepped-configured holes.

That is, on the occasion of the primary molding operation, the protrusions of the mold are fitted in their respective holes 24 of the substrate 11A, so that the substrate 11A is positioned relative to the mold. Meanwhile, on the occasion of the secondary molding operation, the positioning protrusions 42 on the substrate 11A are fitted in their respective recesses of the mold, thereby achieving the positioning of the substrate 11A. Being formed by the primary molding operation, the positioning protrusion 42 on the substrate 11A has an error which is equivalent to that occurring in the primary molded body 21, 22. Meanwhile, the secondary molded body 23 is formed with respect to the positioning protrusion 42, and thus has an error which is equivalent to that occurring in the primary molded body 21, 22. Consequently, the mutual errors between the primary body 21, 22 and the secondary molded body 23 can be minimized, and thus the rate of defectiveness is decreased.

It should be noted that the invention is not limited to the above-described embodiments, and thus various modifications maybe made thereto. For example, the thickness, size, or shape of the cushioning pattern 14 formed around the hole 11a of the substrate 11 may be arbitrarily changed. Moreover, the cushioning sheet may be applicable not only to the primary-mold forming mold but also to the secondary-mold forming mold.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An optical coupling apparatus comprising:

a substrate having a hole;

a light-emitting element disposed on the substrate;

a light-receiving element disposed on the substrate;

a cushioning member disposed around an opening of the hole on a surface of the substrate;

a pair of primary molded bodies made of light-transmitting resin, for covering the light-emitting element and the light-receiving element, respectively; and a secondary molded body made of light-shielding resin interposed between the primary molded bodies, the secondary molded body being fixed onto the substrate by being fitted into the hole of the substrate.

2. The optical coupling apparatus of claim 1, wherein the hole of the substrate is so shaped that its diameter changes gradually so as to be stepped-configured, and wherein an inner wall defining the hole is subjected to metal plating treatment.

* * * * *